(12) United States Patent
Dishongh et al.

(10) Patent No.: US 6,774,310 B1
(45) Date of Patent: Aug. 10, 2004

(54) SURFACE MOUNT CONNECTOR LEAD

(75) Inventors: Terrance J. Dishongh, Hillsboro, OR (US); Prateek J. Dujari, Portland, OR (US); Bin Lian, Hillsboro, OR (US); Damion T. Searls, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 407 days.

(21) Appl. No.: 09/698,898

(22) Filed: Oct. 27, 2000

(51) Int. Cl.$^7$ ................................. H01R 4/02
(52) U.S. Cl. ................................. 174/94 R
(58) Field of Search .............. 174/94 R, 68.1, 174/260, 263; 439/79, 83, 830

(56) References Cited

U.S. PATENT DOCUMENTS

| | | | |
|---|---|---|---|
| 4,537,461 A | * | 8/1985 | Ouellette .............. 439/830 |
| 5,411,236 A | | 5/1995 | Morita et al. |
| 5,910,885 A | | 6/1999 | Gulachenski et al. |
| 5,940,277 A | * | 8/1999 | Farnworth et al. ...... 174/260 X |
| 6,056,558 A | * | 5/2000 | Lin et al. .............. 439/83 |
| 6,083,045 A | | 7/2000 | Chiu |
| 6,217,348 B1 | * | 4/2001 | Lin et al. .............. 439/83 |

FOREIGN PATENT DOCUMENTS

| | | |
|---|---|---|
| EP | 0 954 066 A2 | 11/1999 |
| GB | 2 325 354 A | 11/1998 |

OTHER PUBLICATIONS

International Search Report, European Patent Office, Date of Mailing: May 2, 2002, International application No.: PCT/US 01/31815, International filing date: Oct. 12, 2001, pp. 1–4.

* cited by examiner

*Primary Examiner*—Chau N. Nguyen
(74) *Attorney, Agent, or Firm*—Robert G. Winkle

(57) ABSTRACT

An enhanced joint thickness lead used for surface mounting electronic devices to a substrate, wherein a portion of the enhanced joint thickness lead that is substantially parallel to the substance. The enhanced joint thickness lead includes an arcuate structure, which provides an enhanced joint thickness for the solder used to connect the lead to the substrate. The enhanced joint thickness of the solder results in a more robust attachment of the electronic device.

22 Claims, 11 Drawing Sheets

SURFACE MOUNT CONNECTOR LEAD

BACKGROUND OF THE INVENTION

1. Field of the Invention

The present invention relates to apparatus and methods for mounting electronic compounds to a substrate. In particular, the present invention relates to a lead designed to secure jacks or sockets, which receive plug-in cables, to a printed circuit board.

2. State of the Art

As interfacing and intercommunication between independent electronic devices (personal computers, local area network severs, internet servers, personal digital assistants, digital cameras, computer peripherals, etc.) becomes commonplace, the electronics industry is striving to supplying high reliability, yet inexpensive components for interfacing such independent electronic devices. A typical interfacing device is a cable, which jacks (connects) into connectors existing on or in each of the independent electronic devices. Such connectors include, but are not limited to USB (e.g., universal serial bus), 1394 (e.g., high-speed serial bus), RJ11 (e.g., telephone jack), and RJ45 (e.g., network jack) connectors.

An inexpensive method of attaching the connectors to the internal circuitry of the independent electronic device is by surface mounting the connectors to substrates (such as print circuit boards) within the independent electronic devices. FIGS. 9–11 illustrate an exemplary surface mounted RJ45 connector assembly 200. As shown in FIGS. 9 and 10, a connector 202 is abutted against a first surface 208 of a substrate 204. Referring to FIG. 10, the connector 202 is primarily attached to the substrate first surface 208 by two relatively large (L-shaped) leads 212 and 212'. As shown in FIGS. 10 and 11, a portion (shown in shadow lines in FIG. 10) of each of the large leads 212 and 212' extend into the connector 202, wherein they are electrically connected to routing wires (not shown) therein. Referring to FIG. 10, first portions 214 and 214' of the large leads 212 and 212', respectively, extend from the connector 202 abutting sides 218 and 222, respectively, of the connector 202. At the substrate first surface 208, second portions 216 and 216' of the large leads 212 and 212', respectively, extend substantially parallel to the substrate first surface 208. As shown in FIG. 11 (showing only large lead 212 for clarity), the large lead second portion 216 is physically and electrically attached to a landing contact 220 on or in the substrate first surface 208 with a layer of solder, such as a lead/tin alloy, forming solder joint 226. The landing contact 220 is electrically connected to traces (not shown) in or on the substrate 204.

As shown in FIG. 9, additional, smaller leads 224 may extend from the connector sides 218 and 222 (not shown for connector side 222) and electrically connected to traces (not shown) in or on the substrate 204. The large leads 212 and 212' and the smaller leads 224 are the means by which electrical signals (power, ground, operational, etc.) are communicated from electronic components (not shown) mounted on the substrate 204 to the connector 202. A plug on cable (not shown) connected to an external device (not shown) is inserted into opening 206 to make electrical contact with the connector 202, whereby allowing electrical communication between an external device (not shown) and electronic components (not shown) mounted to the substrate 204.

Connectors 202 generally have cables (e.g., network interface cables for the RJ45 connector shown) connected and disconnected repeatedly over the course of the life of the connectors 202. The large leads 212 and 212' are relied upon to carry stress loads resulting connecting and disconnecting of the cables. Furthermore, the connector 202 also relies upon the large leads 212 and 212' to carry the stress from the coefficient of thermal expansion (CTE) mismatch between the substrate 204 and the connector 202. These stresses may cause the solder joint 226 under the large leads 212 and 212' to fail (e.g., crack) due to shear stress developed in these loads.

Therefore, it would be advantageous to develop a lead design which will effectively achieve a connection of a connector to a substrate while being capable of handling the stresses induced on the connector by connecting/disconnecting cables and by CTE mismatch.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings to which:

DETAILED DESCRIPTION OF THE ILLUSTRATED EMBODIMENT

Figure 1:
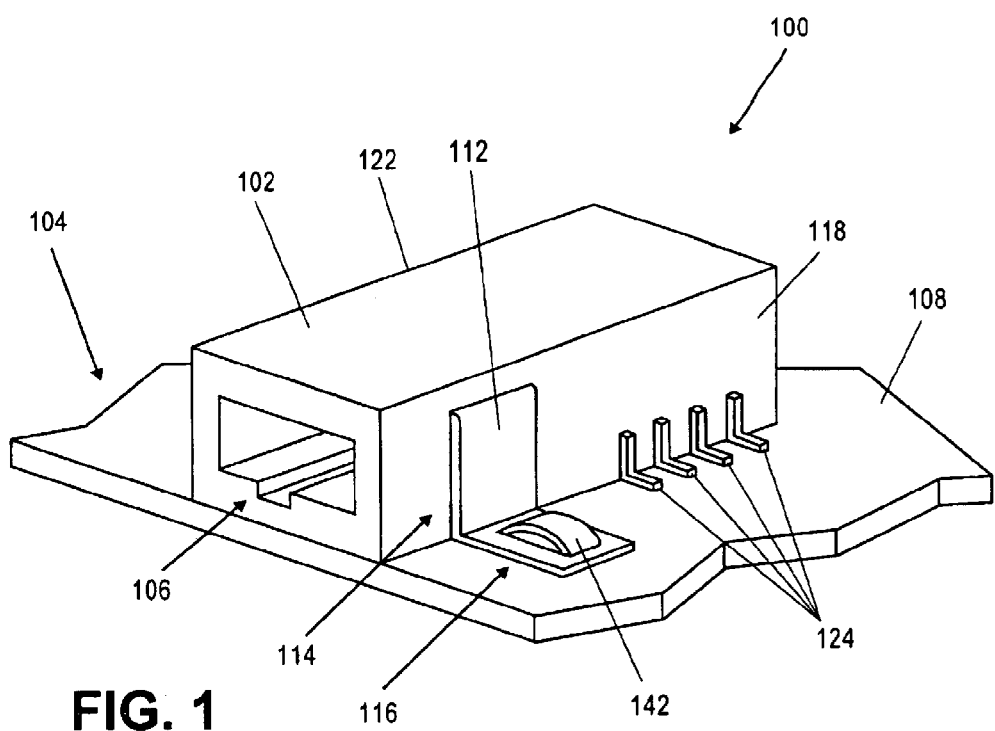
FIG. 1 is an oblique view of the connector with an embodiment of an enhanced joint thickness lead, according to the present invention.

In the following detailed description, reference is made to the accompanying drawings that show, by way of illustration, specific embodiments in which the invention may be practiced. These embodiments are described in sufficient detail to enable though skilled in the art to practice the invention. It is to be understood that the various embodiments of the invention, although different, are not necessarily mutually exclusive. For example, a particular feature, structure, or characteristic described herein, in connection with one embodiment, may be implement within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The term "substrate" is defined to include, but is not limited to, motherboards, peripheral cards, cartridges, multi-chip module substrates, and similar structures as will be evident to one skilled in the art.

The term "solder" is defined to include, but is not limited to, electrically conductive materials such as lead, tin, indium, gallium, bismuth, cadmium, zinc, copper, gold silver, antimony, germanium, and alloys thereof.

Figure 8:
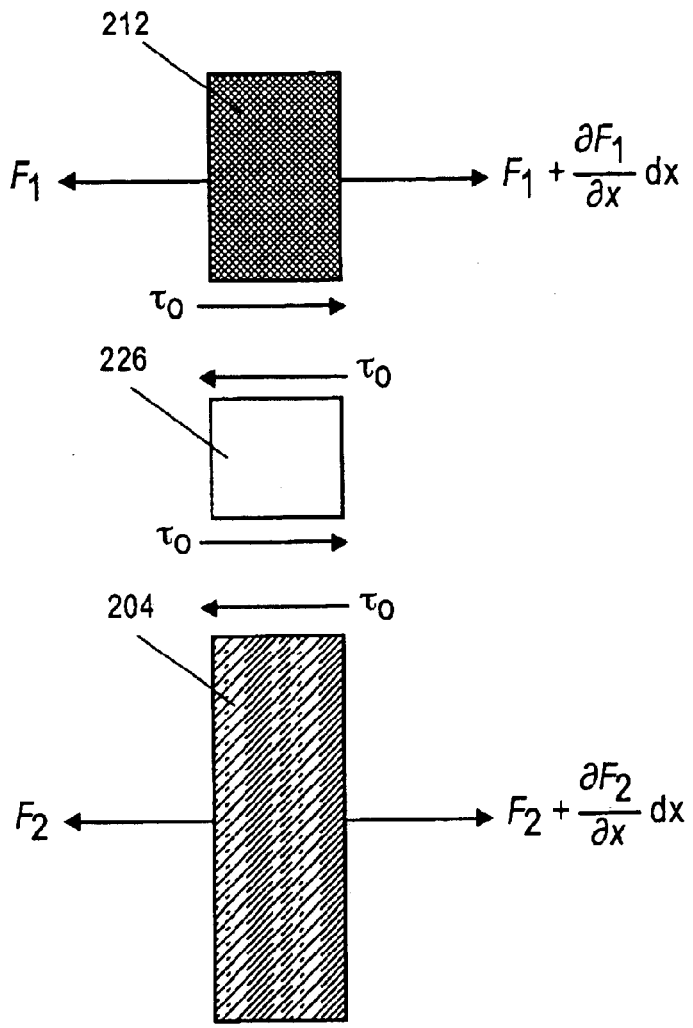
FIG. 8 is a schematic of the forces induced on the typical lead, as known in the art.
Figure 9:
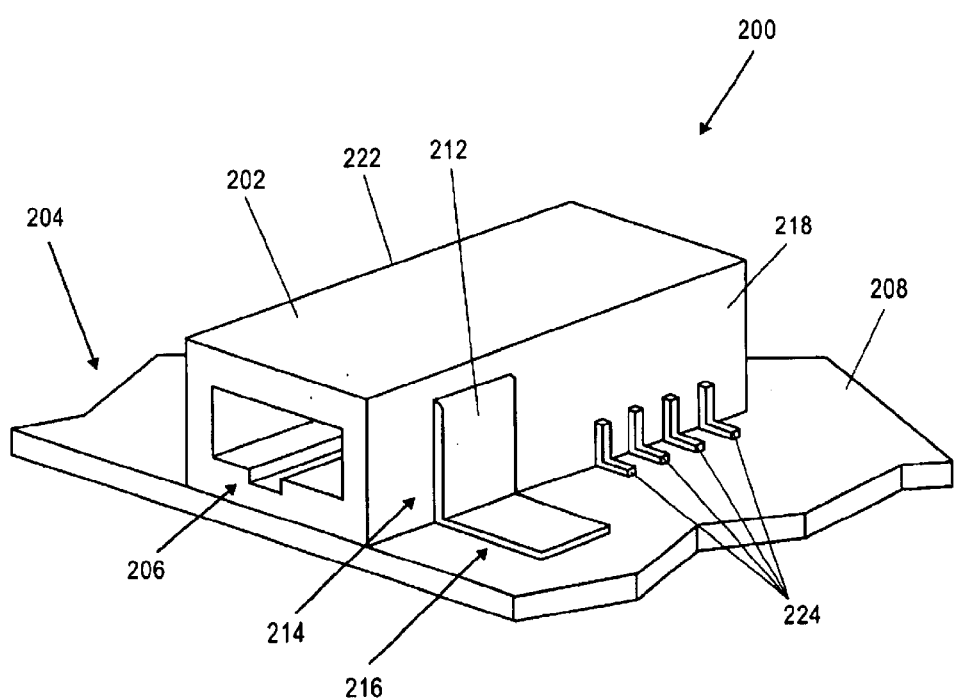
FIG. 9 is an oblique view of a connector with a typical lead, as known in the art.
Figure 10:
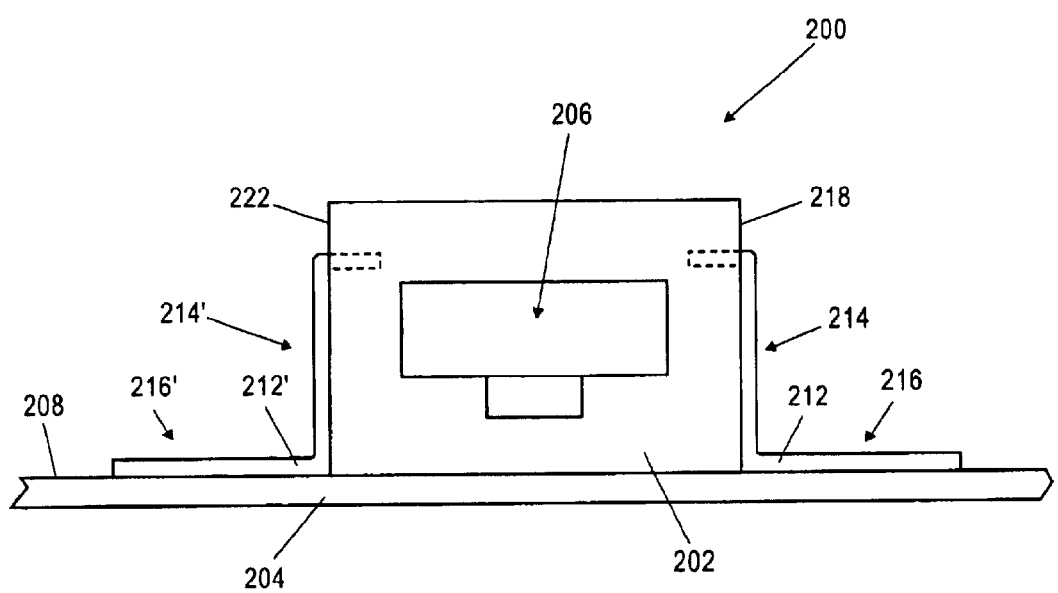
FIG. 10 is a side plan view of the lead of FIG. 9, as known in the art.

The present invention reduces the stress induced failures (solder cracking) in surface mounted microelectronic devices. Referring to the free-body diagram of FIG. 8 and to the corresponding portions of FIG. 11, the shear stresses in the solder joint 226 can be analyzed. From the force and shear assignments labeled in FIG. 8, the following two equations of equilibrium may be written:

$$\frac{dF_1}{dx}dx - \tau dx = 0 \quad \text{and} \quad \frac{dF_2}{dx}dx - \tau dx = 0$$

where: Subscript 1 denotes the lead 212

Subscript 2 denotes the substrate 204

Figure 11:
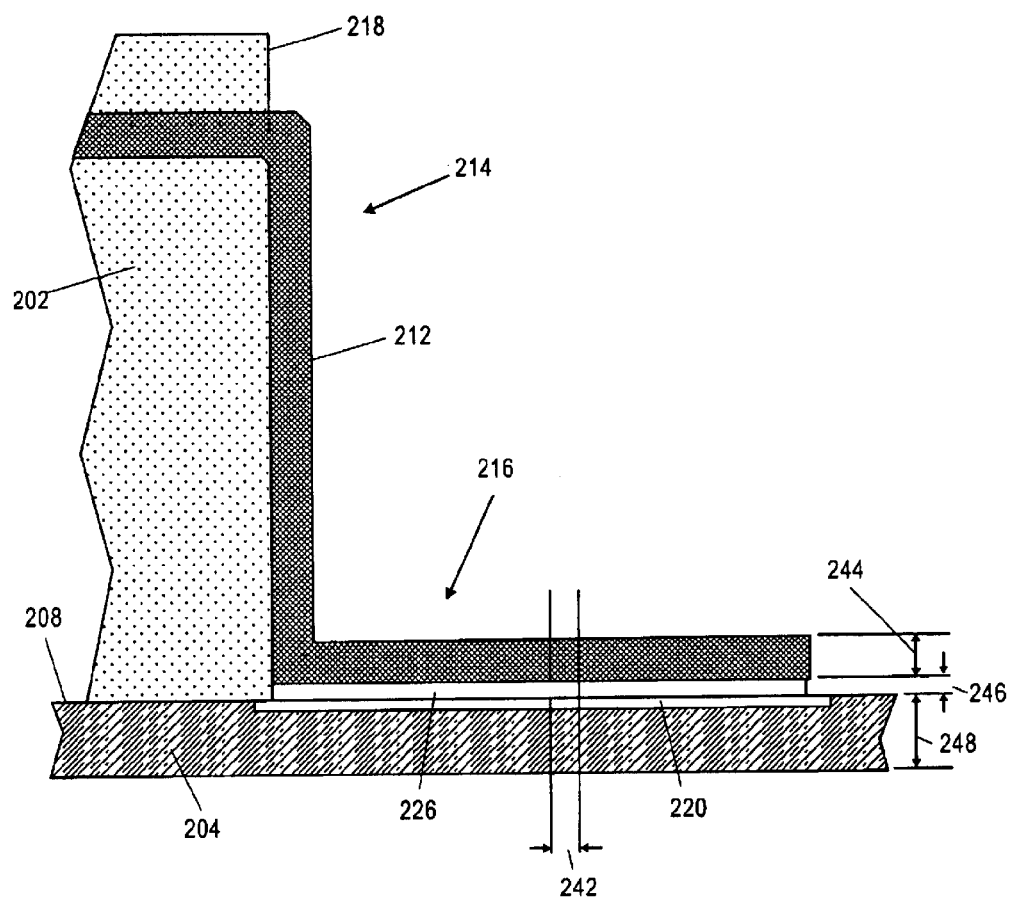
FIG. 11 is a side cross-section view of the lead of FIG. 10, as known in the art.

F is force $\tau$ is the shear stress x is the spatial variable inside the lead 212 and the substrate 204 (see element 242 in FIG. 11)

The strain on the lead 212 and substrate 204, which can arise both from internal forces (strain developed in manufacturing the device), external forces (plugging and unplugging cables), and CTE forces, may be expressed in terms of displacements (u). Thus:

$$\frac{du_1}{dx} = \frac{F_1}{E_1 t_1} + \alpha_1 \Delta T \quad \text{and} \quad \frac{du_2}{dx} = \frac{F_2}{E_2 t_2} + \alpha_2 \Delta T$$

where: $\alpha$ is the coefficient of thermal expansion $\Delta T$ is temperature change $t_1$ is the thickness of the lead (shown as 244 in FIG. 11)

$t_2$ is the thickness of the substrate (shown as 248 in FIG. 11)

E is Young's modulus

Through Hooke's law, the shear stress can be related to the displacement of the lead $u_1$ and the substrate $u_2$, the thickness of the solder $t_0$ (shown as 246 in FIG. 11), and the shear modulus G, (provided that $u_1$ and $u_2$ displace with the solder material), in the following manner:

$$\frac{\tau}{G} = \frac{u_1 - u_2}{t_0}$$

By taking the second derivative of the above equations, ones arrives at:

$$\frac{d^2 \tau}{G dx^2} = \frac{1}{t_0}\left[\frac{d^2 u_1}{dx_2} - \frac{d^2 u_2}{dx_2}\right]$$

Since $dF/dx = \tau$ and using the equilibrium equations above, one can make the following substitutions:

$$\frac{d^2 \tau}{dx^2} = \beta^2 \tau \quad \text{where} \quad \beta^2 = \frac{G}{t_0}\left[\frac{1}{E_1 t_1} - \frac{1}{E_2 t_2}\right]$$

Hence, the above equation is an ordinary differential equation, which when using the appropriate boundary condition has the solution of:

$$\tau(x) = \frac{G[\alpha_2 - \alpha_1]\Delta T}{t_0 \beta}\left[\frac{\sinh(\beta x)}{\cosh(\beta L)}\right]$$

It is apparent from the above equation that as the thickness of the solder ($t_0$) increases, the stress decreases. In addition, as $t_0$ increases, the parameter $\beta$ decreases. Hence, to mitigate the onset of crack propagation and subsequent solder joint failure, it would be desirable to make the solder joint 226 thicker. However, there are serious manufacturing implications that effect yield loss to add a higher stand off in the large pin. In manufacturing studies, this yield loss may increase as much as 1% for thicker joints.

Thus, the present invention involves the formation of an enhanced joint thickness lead that can be easily manufacture using known stamping techniques. Although the present discussion relates to a RJ45 connector, the lead of the present invention may be used with any surface mounted electronic devices including, but are not limited to USB, 1394, RJ11 connectors, as well as, a variety of components including, but not limited to, CPU sockets, slots (PCI, ISA, AGP, etc.), coils, FETs, and other such components as will be evident to one skilled in the art.

Figure 2:
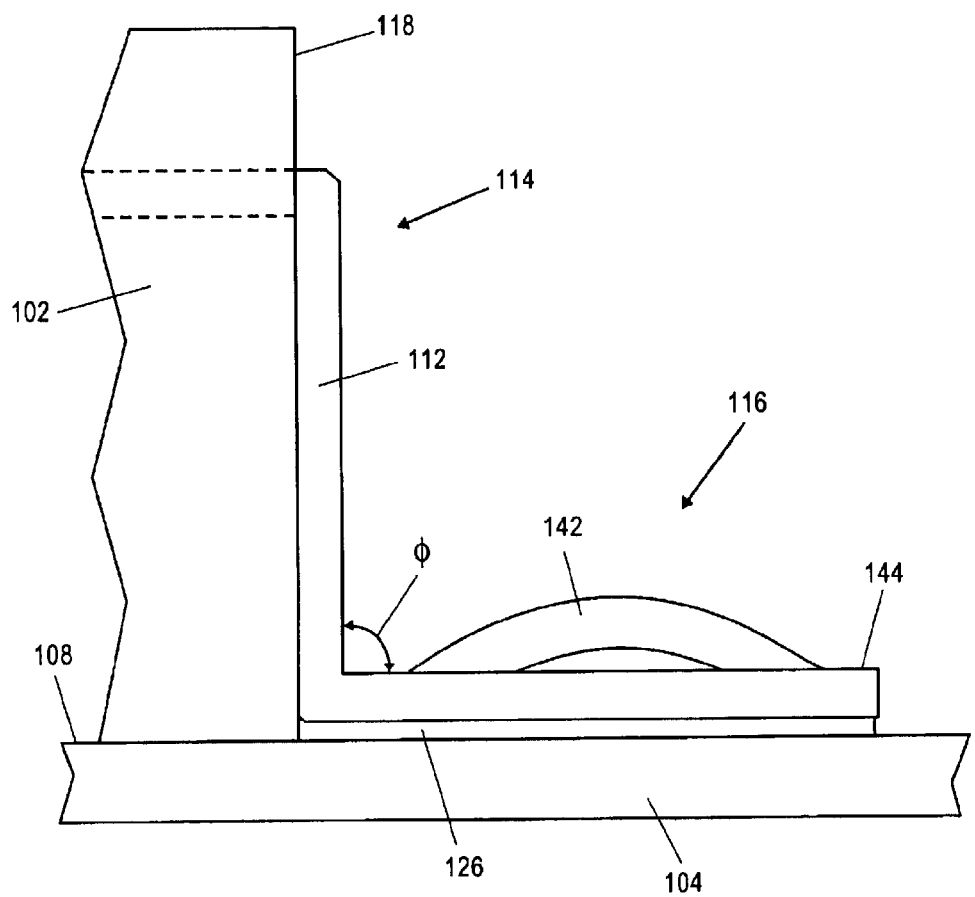
FIG. 2 is a side plan view of the enhanced joint thickness lead of FIG. 1, according to the present invention.
Figure 3:
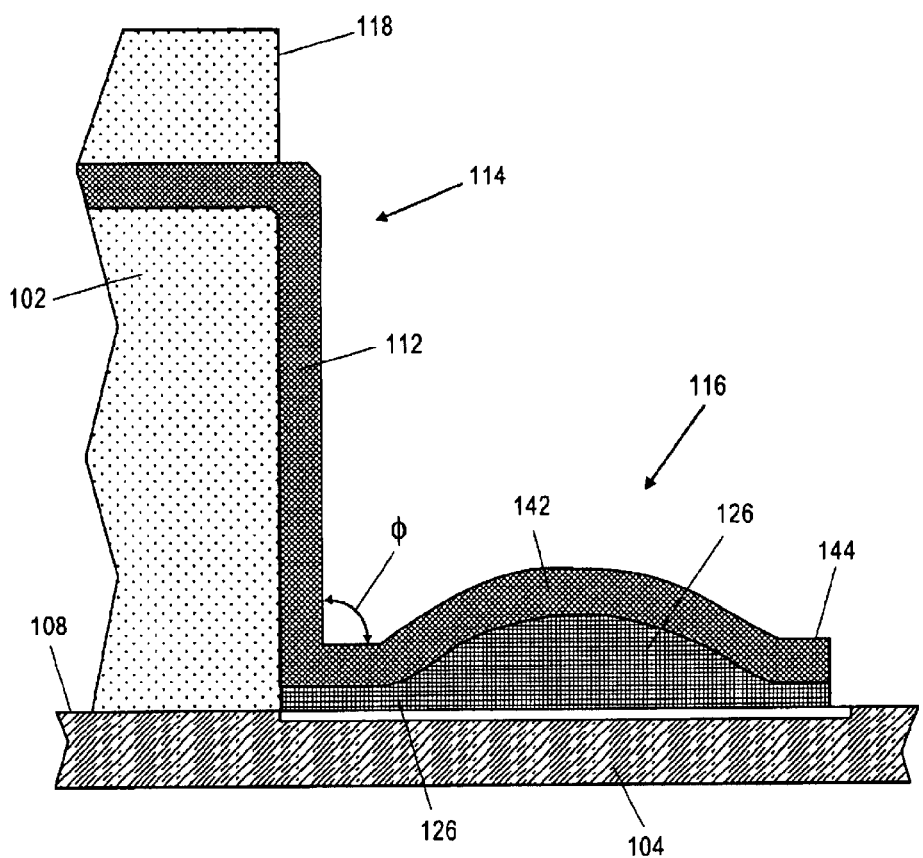
FIG. 3 is a side cross-section view of the enhanced joint thickness lead of FIG. 2, according to the present invention.

FIGS. 1–3 illustrate an exemplary surface mounted RJ45 connector assembly 100. As shown in FIG. 1, a connector 102 is abutted against a first surface 108 of a substrate 104. Referring to both FIGS. 1 and 2, the connector 102 is primarily attached to the substrate first surface 108 by at least one enhanced joint thickness lead 112. The enhanced joint thick lead 112 is preferably a conductive material, including, but not limited to, metals such as copper and aluminum.

As shown in FIG. 2, a portion of each of the enhanced joint thickness lead 112 extend into the connector 102 and are electrically connected to routing wires (not shown) therein. Referring to FIG. 2, a first portion 114 of the enhanced joint thickness lead 112, extends from the connector 102 abutting a first side 118 of the connector 102. At the substrate first surface 108, a second portion 116 of the enhanced joint thickness lead 112 extends substantially parallel to the substrate first surface 108. Preferably, at least one other enhanced joint thickness lead, which is similar to the enhanced joint thickness lead 112, abuts a second side 122 of the connector 102.

As shown in FIG. 3, the lead second portion 116 is physically and electrically attached to a landing contact 120 on or in the substrate first surface 108 with a layer of solder, forming solder joint 126. The landing contact 120 may be of any appropriate material, including, but not limited to, copper, aluminum, and alloys thereof. The landing contact 120 is electrically connected to traces (not shown) in or on the substrate 104.

The lead second portion 116 includes an arcuate portion, shown as arch 142, which extends above an upper surface 144 of the lead second portion 116. The arch 142 may be formed by cutting two substantially parallel through the lead second portion 116 in the direction of the length of the lead second portion 116 and bending the portion of the lead second portion 116 between the slots to form the arch 142 which inherently forms a void. As will be evident to one skilled in the art. The cutting of the substantially parallel lines and the bending of the arch may be performed with a two-step stamping process.

The void created by the arch 142 allows a greater thickness to exist in the solder joint 126, as demonstrated in FIG. 3. Solder joint failure is typically due to the development of microcracks caused by strain loading in the joint resulting from connecting and disconnecting of cables and/or from the stresses from the coefficient of thermal expansion (CTE) mismatch between the substrate 104 and the connector 102. Overtime these microcracks coalesce to form cracks, which eventually connect to each other to form a crack through the solder joint. This crack propagation, due primarily to CTE stressing and low stress cycle fatigue (caused by loading and unloading of the connection), is generally slow and tends to happen over numerous cycles, typically 50 to 10000 cycles, or more.

The thicker solder joint 126 (i.e., the higher volume) increases the distance of microcrack propagation. Thus, microcracks have a lessened chance of completely cracking on the solder joint 126. In fact, the enhanced joint thickness lead 112 can result in as much as about a 20% decrease in maximum shear stress. Assuming a typical lead configuration, wherein the lead has a length of 3.5 mm, a width of 7.0 mm, and a solder of thickness of 0.0875 mm, the solder volume would be about 2.1 mm$^3$. Now, for the enhanced joint thickness lead 112, it has been assumed that the arch 142 has at its peak had a height equal to the thickness, and at its most developed region covered 30% of the surface of the lead second portion 116. It has been further assumed that the arch 146 spanned one-half the width and would make a volume of a segment of a hexahegon, which results in an additional volume of about 0.65 mm$^3$ or a total volume of about 2.75 mm$^3$. This represents about a 30% increase in solder volume. It is, of course, understood that these estimates represent neither a maximum or minimum requirement for effective inhibition of microcrack propagation, rather these measurements are merely exemplary. It will be understood by one skilled in the art that a variety of volumes could be achieved and may be altered depending on the type of solder used, the size of the lead, and other such parameters.

As shown in FIG. 1, additional, smaller leads 124 may extend from the connector side 118 (not shown for connector side 122) and electrically connected to traces (not shown) in or on the substrate 104. The enhance lead 112 and the smaller leads 124 may be the means by which electrical signals (power, ground, operational, etc.) are communicated from electronic components (not shown) mounted on the substrate 104 to the connector 102. A plug (not shown) on cable connected to an external device (not shown) is inserted into opening 106 to make electrical contact with the connector 102, whereby allowing electrical communication between an external device (not shown) and electronic components (not shown) mounted to the substrate 104.

Figure 4:
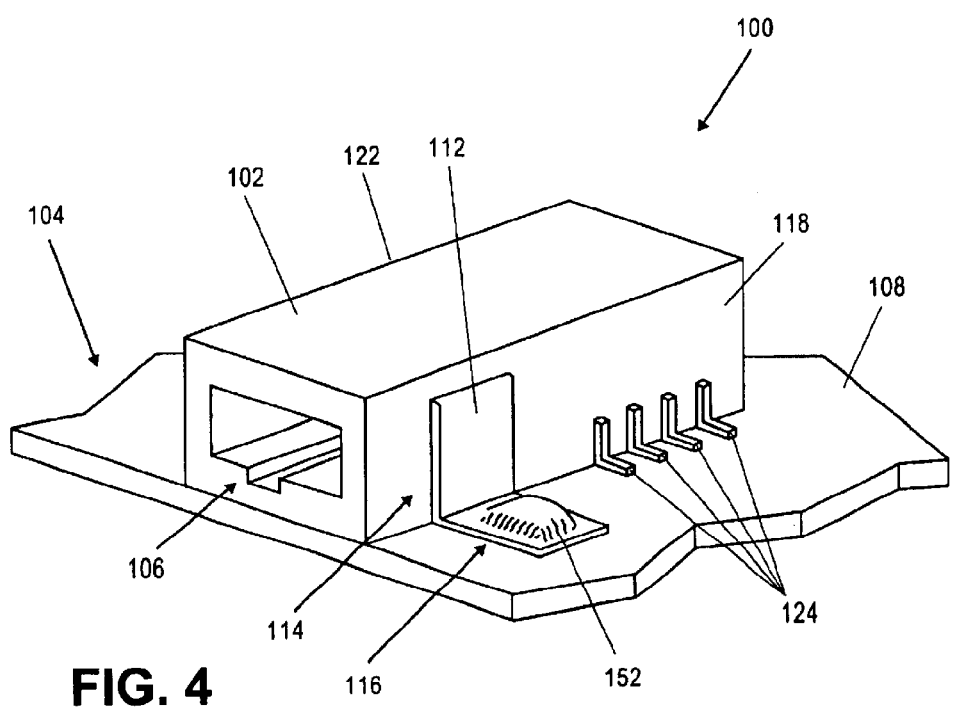
FIG. 4 is an oblique view of the connector with another embodiment of an enhanced joint thickness lead, according to the present invention.
Figure 5:
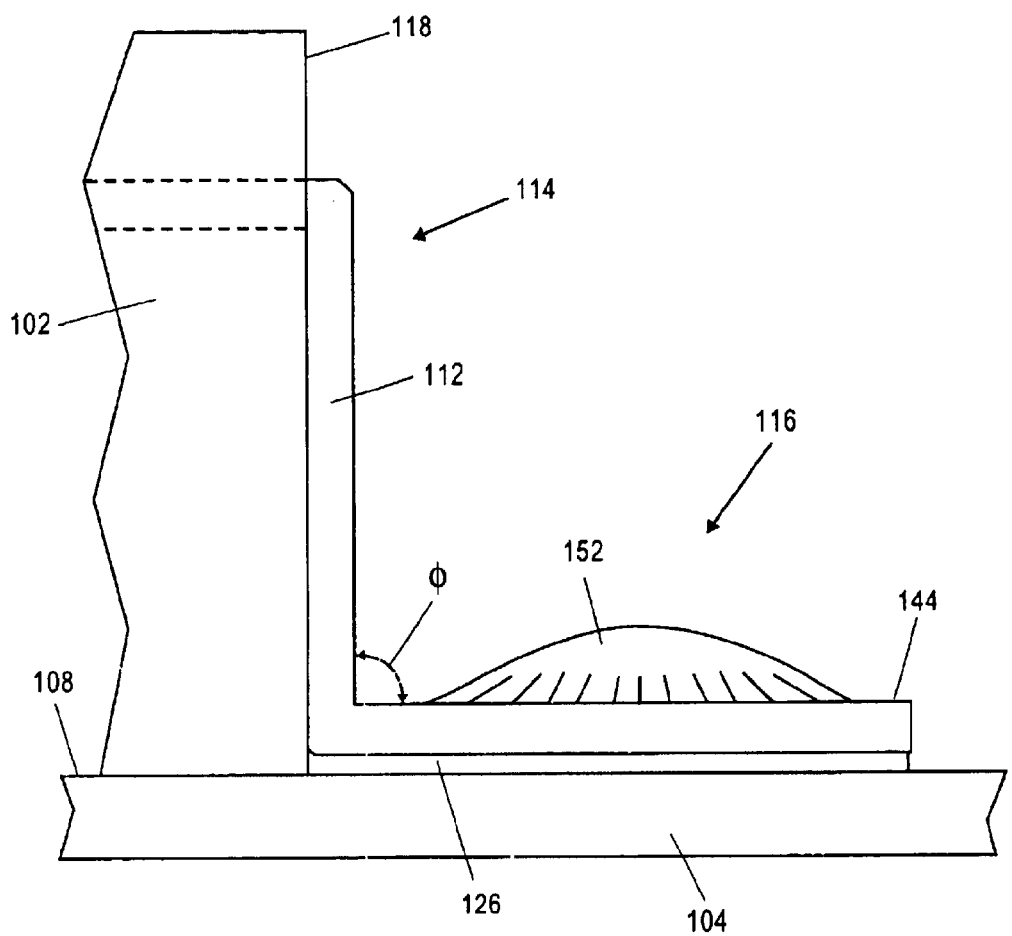
FIG. 5 is a side plan view of the enhanced joint thickness lead of FIG. 4, according to the present invention.

FIGS. 4 and 5 illustrate another embodiment of the present invention, wherein the arcuate portion comprises a substantially concave pocket 152 that extends above a lead second portion upper surface 144, thereby inherently forming a void. The concave pocket 152 may be formed by simply stamping it into the enhanced joint thickness lead 112, as will be evident to one skilled in the art. The void of the concave pocket 152 also results in a greater thickness to exist in the solder joint 126, as was demonstrated in FIG. 3 for the embodiment presented therein.

Figure 6:
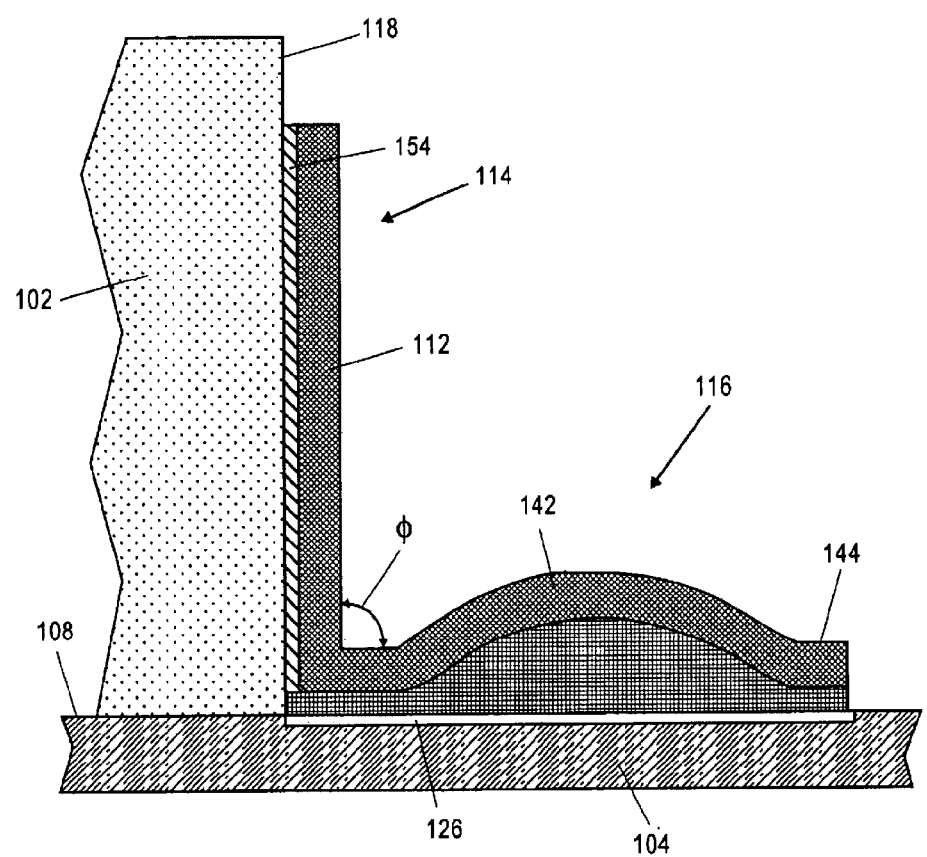
FIG. 6 is a side cross-section view of yet another embodiment of an enhanced joint thickness lead, according to the present invention.

It is, of course, understood that the enhanced joint thickness lead 112 need not be an electrical conductor. Rather, it may merely be a stabilizing and/or attachment mechanism. FIG. 6 illustrates such an embodiment. The lead first portion 114 may be attached to the connector first side 118 with a layer of adhesive material 154 and the lead second portion 116 may be connected to the substrate 104 with a solder joint 126, as previously discussed.

Figure 7:
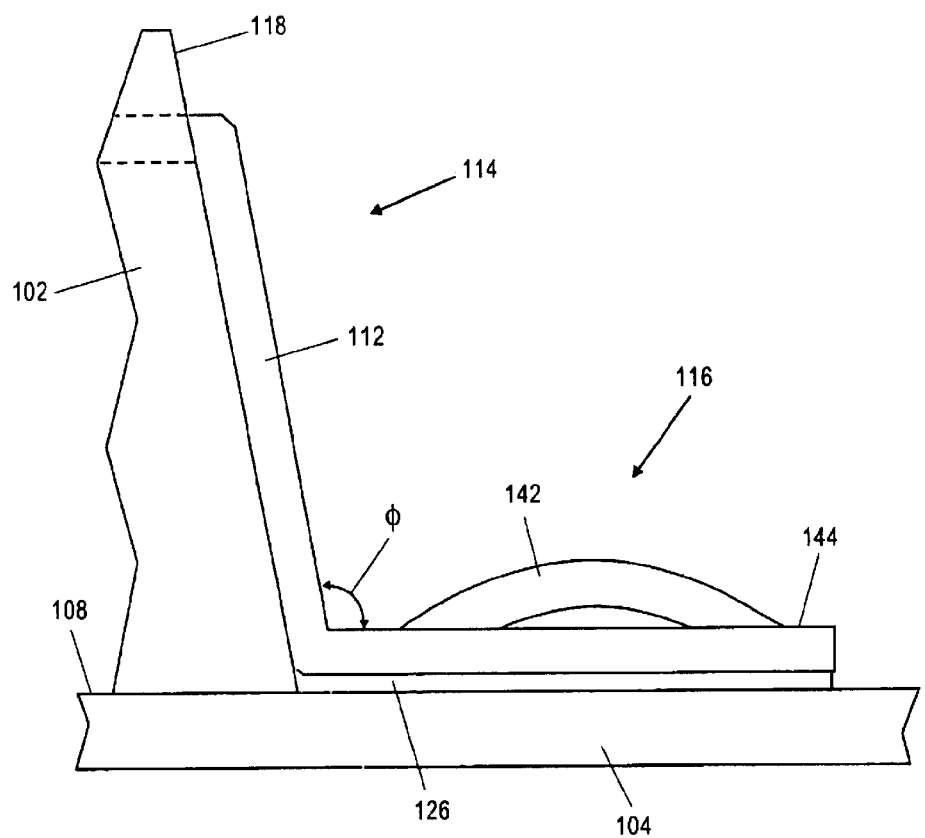
FIG. 7 is a side plan view of still another embodiment of an enhanced joint thickness lead lead, according to the present invention.

It is also understood that the enhanced joint thickness lead 112 may have a variety of shapes to conform to the shape of the connector 102. As shown in FIGS. 2, 3, 5, and 6, the angle φ between the lead first portion 114 and lead second portion 116 is preferably about 90 degrees. However, the angle φ may be angle great than zero and less 180 degrees. For example, in FIG. 7, the angle φ is shown as obtuse to conform to the shape of the connector 102.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A lead for attaching an electronic device to a substrate, comprising:
   a first lead portion adapted to abut a side of said electronic device; and
   a second lead portion having a first surface adapted to attach to said substrate and having a second surface opposing said first surface, wherein said second lead portion includes an arcuate structure extending from said second lead portion.

2. The lead of claim 1, wherein said arcuate structure comprises a portion of said lead second portion partially detached therefrom and bent to form an arch.

3. The lead of claim 1, wherein said arcuate structure comprises a substantially concave pocket formed from a portion of said lead second portion.

4. The lead of claim 1, wherein a portion of said first lead portion is adapted to extend into said electronic device.

5. The lead of claim 4, wherein said lead comprises a conductive material.

6. The lead of claim 1, wherein said first lead portion and said lead second portion are oriented substantially perpendicularly to one another.

7. An electronic assembly, comprising:
   an electronic device abutting a substrate;
   a lead having a first lead portion abutting a side of said electronic device and having a second lead portion adjacent said substrate; and
   said second lead portion having a first surface attached to said substrate with a solder material, and having a second surface opposing said first surface, and including an arcuate structure extending from said second lead portion defining a void, wherein at least a portion of said solder material resides in said void.

8. The electronic assembly of claim 7, wherein said arcuate structure comprises a portion of said lead second portion partially detached therefrom and bent to form an arch.

9. The electronic assembly of claim 7, wherein said arcuate structure comprises a substantially concave pocket formed from a portion of said lead second portion.

10. The electronic assembly of claim 7, wherein a portion of said first lead portion is adapted to extend into said electronic device.

11. The electronic assembly of claim 7, wherein said first lead portion and said lead second portion are oriented substantially perpendicularly to one another.

12. The electronic assembly of claim 7, wherein said lead comprises a conductive material.

13. The electronic assembly of claim 12, wherein said lead is adapted to conduct an electric signal between said electronic device and said substrate.

14. A method of forming an enhanced joint thickness lead for attaching an electronic device to a substrate, comprising:

providing a lead having a first portion and a second portion, said first portion adapted to abut a side of said electronic device, and said second portion having a first surface and an opposing second surface; and forming an arcuate structure extending from said lead second surface.

15. The method of claim 14, wherein forming said arcuate structure comprises:

cutting two substantially parallel slots through said lead second portion; and bending a portion of the lead second portion between said slots to form an arch.

16. The method of claim 14, wherein forming said arcuate structure comprises forming a substantially concave pocket from a portion of said lead second portion.

17. The method of claim 14, further including orienting said lead first portion to be substantially perpendicular to said lead second portion.

18. A method of forming an electronic device assembly, comprising:

providing at least one lead having a first portion and a second portion, said second portion having a first surface and an opposing second surface;

forming an arcuate structure extending from said at least one lead second portion defining a void;

attaching said at least one lead first portion to a side of an electronic device;

attaching said at least one lead second portion to a substrate with a solder material, wherein at least a portion of said solder material resides in said arcuate structure void.

19. The method of claim 18, wherein forming said arcuate structure comprises:

cutting two substantially parallel slots through said lead second portion; and bending a portion of the lead second portion between said slots to form an arch.

20. The method of claim 18, wherein forming said arcuate structure comprises forming a substantially concave pocket from a portion of said lead second portion.

21. The method of claim 18, further including orienting said lead first portion to be substantially perpendicular to said lead second portion.

22. The method of claim 18, wherein attaching said at least one lead second portion to a substrate with a solder material comprises attaching said at least one lead second portion to a landing contact of said substrate.

* * * * *